United States Patent
Akiyama et al.

(10) Patent No.: US 11,525,856 B2
(45) Date of Patent: Dec. 13, 2022

(54) INSPECTION APPARATUS AND INSPECTION METHOD

(71) Applicant: Tokyo Electron Limited, Tokyo (JP)

(72) Inventors: Naoki Akiyama, Nirasaki (JP); Susumu Saito, Nirasaki (JP); Hiroyuki Nakayama, Nirasaki (JP); Shigeru Kasai, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/287,836

(22) PCT Filed: Oct. 17, 2019

(86) PCT No.: PCT/JP2019/040941
§ 371 (c)(1),
(2) Date: Apr. 22, 2021

(87) PCT Pub. No.: WO2020/085205
PCT Pub. Date: Apr. 30, 2020

(65) Prior Publication Data
US 2021/0382105 A1    Dec. 9, 2021

(30) Foreign Application Priority Data
Oct. 25, 2018    (JP) .............................. JP2018-201035

(51) Int. Cl.
*G01R 31/28*    (2006.01)
*G01R 31/308*    (2006.01)
*H01L 27/146*    (2006.01)

(52) U.S. Cl.
CPC ....... *G01R 31/2829* (2013.01); *G01R 31/308* (2013.01); *H01L 27/1464* (2013.01)

(58) Field of Classification Search
CPC .. G01R 31/28; G01R 31/308; G01R 31/2829; G01R 31/2865; G01R 31/2874; H01L 27/146; H01L 27/1464
(Continued)

(56) References Cited

FOREIGN PATENT DOCUMENTS

| JP | 2004-287368 A | 10/2004 |
|----|---------------|---------|
| JP | 2005-44853 A  | 2/2005  |

(Continued)

OTHER PUBLICATIONS

Espacenet English translation Asakawa et al. JP 2009170730 A "Inspecting Apparatus for Back Irradiating Type Solid-State Imaging Device" (Year: 2009).*

(Continued)

*Primary Examiner* — Jermele M Hollington
*Assistant Examiner* — Courtney G McDonnough
(74) *Attorney, Agent, or Firm* — Nath, Goldberg & Meyer; Jerald L. Meyer; Tanya E. Harkins

(57) ABSTRACT

An inspection apparatus for inspecting a backside irradiation type imaging device formed on an inspection object includes: a stage on which the inspection object is mounted such that the stage faces a rear surface of the backside irradiation type imaging device, wherein the stage includes: a transmitter including a flat plate formed of a light transmitting material, and configured to mount the inspection object on the transmitter; and a light emitter disposed at a location facing the inspection object with the transmitter interposed between the light emitter and the inspection object, and configured to emit light toward the transmitter, and wherein the transmitter transmits the light from the light emitter while diffusing the light.

9 Claims, 6 Drawing Sheets

(58) Field of Classification Search
USPC .................................................. 324/754.23
See application file for complete search history.

(56) References Cited

FOREIGN PATENT DOCUMENTS

| JP | 2009-170730 A | | 7/2009 | |
|----|---------------|---|--------|---|
| JP | 2009162508 A | * | 7/2009 | ............. G01R 31/26 |
| JP | 2012168091 A | * | 9/2012 | ......... G01N 21/1702 |
| JP | 2018-151369 A | | 9/2018 | |

OTHER PUBLICATIONS

Espacenet English translation Hasegawa JP 2009162508 A "Actinometer" (Year: 2009).*

Espacenet English translation Irisawa JP 2012168091 A "Photoacoustic Imaging Device, Probe Unit Used in the Same, and Operation Method of Photoacoustic Imaging Device" (Year: 2012).*

\* cited by examiner

INSPECTION APPARATUS AND INSPECTION METHOD

This is a National Phase Application filed under 35 U.S.C. 371 as a national stage of PCT/JP2019/040941, filed Oct. 17, 2019, an application claiming the benefit of Japanese Application No. 2018-201035, filed Oct. 25, 2018, the content of each of which is hereby incorporated by reference in its entirety.

TECHNICAL FIELD

The present disclosure relates to an inspection apparatus and an inspection method.

BACKGROUND

An inspection apparatus of Patent Document 1 includes: a probe card installed above a solid state imaging sensor, which is an inspection target, and provided with a probe needle that can be connected to the solid state imaging sensor; a test head that supplies power and various signals to the solid state imaging sensor; and a light source that irradiates the inspection target with light. In this inspection apparatus, the probe card located above the solid state imaging sensor is located below the test head, and the light source is located above the test head. In other words, the solid state imaging sensor is located below the probe card, and the light source is located above the probe card. Further, in this inspection apparatus, an opening is formed in the probe card so that the solid state imaging sensor located below the probe card is irradiated with the light from the light source located above the probe card.

PRIOR ART DOCUMENT

Patent Document

Patent Document 1: Japanese laid-open publication No. 2005-44853

The technique according to the present disclosure makes it possible to perform inspection of a backside irradiation type imaging device within a short time period, and to irradiate an inspection target, on which the imaging device is formed, with light having a uniform in-plane intensity distribution.

SUMMARY

According to one aspect of the present disclosure, there is provided an inspection apparatus for inspecting an inspection target device formed on an inspection object, the inspection target device being a backside irradiation type imaging device into which light is incident from a rear surface of the backside irradiation type imaging device, which is a surface opposite to a side on which a wiring layer is provided, the inspection apparatus including: a stage on which the inspection object is mounted such that the stage faces the rear surface of the imaging device, wherein the stage includes: a transmitter including a flat plate formed of a light transmitting material, and configured to mount the inspection object on the transmitter; and a light emitter disposed at a location facing the inspection object with the transmitter interposed between the light emitter and the inspection object, and configured to emit light toward the transmitter, and wherein the transmitter transmits the light from the light emitter while diffusing the light.

According to the present disclosure, it is possible to perform inspection of a backside irradiation type imaging device within a short time period, and to irradiate an inspection target, on which the imaging device is formed, with light having a uniform in-plane intensity distribution.

DETAILED DESCRIPTION

Figure 1:
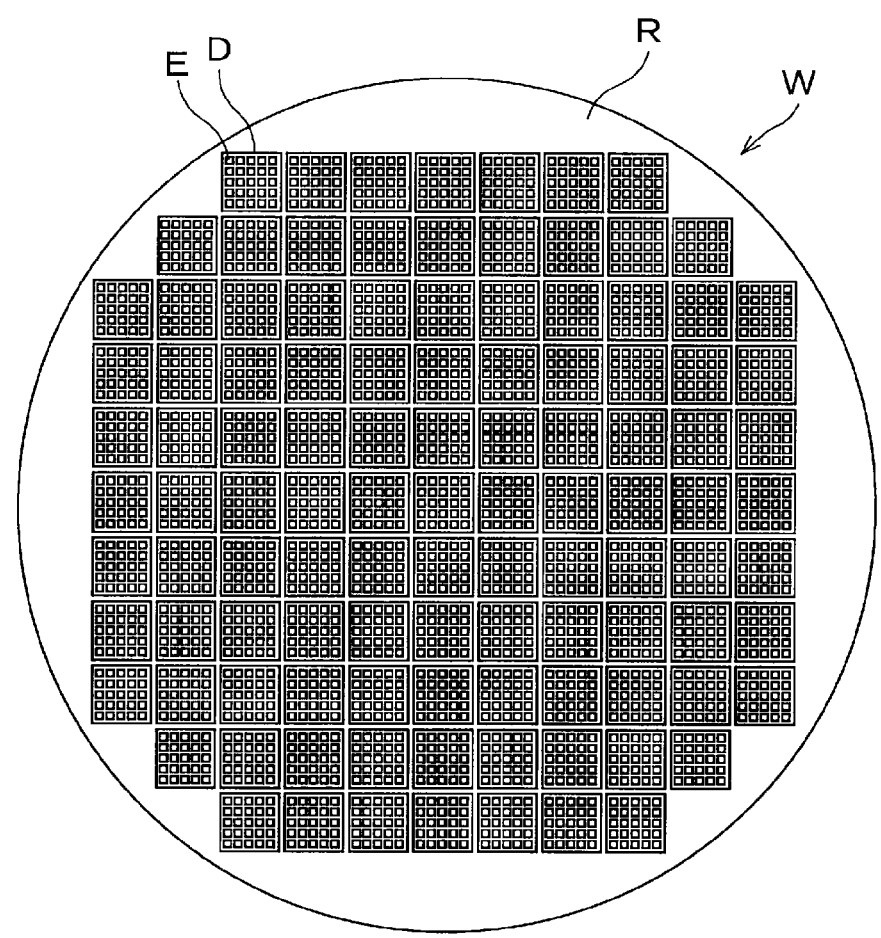
FIG. 1 is a plan view schematically showing a configuration of a wafer on which a backside irradiation type imaging device is formed.

In a semiconductor manufacturing process, a plurality of semiconductor devices having a circuit pattern is formed on a semiconductor wafer (hereinafter referred to as a "wafer"). The formed semiconductor devices are inspected for electrical characteristics and the like, and are classified into non-defective products and defective products. The inspection of the semiconductor devices is performed by using an inspection apparatus called a prober or the like, for example, in a state of the wafer before the semiconductor devices are divided. In the inspection apparatus, a probe card having a plurality of probe needles is installed above the wafer, that is, above the semiconductor devices, and the probe card and the semiconductor devices are brought close to each other during inspection. Subsequently, with the probe needles in contact with electrodes of the semiconductor devices, an electric signal is supplied to the semiconductor devices from a test head installed above the probe card via the probe needles. Then, based on electric signal received by the test head from the semiconductor devices via the probe needles, it is selected whether or not the semiconductor devices are defective.

When a semiconductor device is an imaging device such as a CMOS sensor, unlike other general semiconductor devices, inspection is performed while irradiating the imaging device with light (see Patent Document 1).

In the inspection apparatus of Patent Document 1, as described above, the solid state imaging sensor is located below the probe card, and the light source is located above the probe card. Further, in this inspection apparatus, the opening is formed in the probe card so that the solid state imaging sensor located below the probe card is irradiated with the light from the light source located above the probe card.

When the light source is located above the probe card as in Patent Document 1, it is necessary to form the opening in the probe card. Therefore, the number of probe needles that can be formed in the probe card is limited as compared with a case where the opening is not formed, which results in a long inspection time. In particular, when the number of electrodes to be brought into contact with the probe needles increases, such as when a memory is mounted on the imaging device, the inspection time becomes longer.

Further, in recent years, as an imaging device, a backside irradiation type imaging device that receives light incident from a side of a rear surface opposite to a side of a front surface on which a wiring layer is formed has been developed. However, in the inspection apparatus in which the probe needles are located above the imaging device, as in Patent Document 1, when the light source is located above the probe card, that is, when the light is emitted from above the imaging device during inspection, the backside irradiation type imaging device cannot be inspected.

Furthermore, there is a demand for batch inspection of a plurality of imaging devices formed on the same wafer, and therefore, it is required to irradiate the wafer with light having a uniform light intensity distribution in the plane of the wafer.

Therefore, the technique according to the present disclosure makes it possible to perform inspection of a backside irradiation type imaging device within a short time period, and to irradiate an inspection target, on which the imaging device is formed, with light having a uniform in-plane intensity distribution.

Hereinafter, an inspection apparatus and an inspection method according to embodiments will be described with reference to the drawings. Throughout the present specification and the drawings, elements having substantially the same functional configuration are denoted by the same reference numerals, and therefore, explanation thereof will not be repeated.

Since the technique according to the present embodiments relates to inspection of a backside irradiation type imaging device, the backside irradiation type imaging device will be first described.

Figure 2:
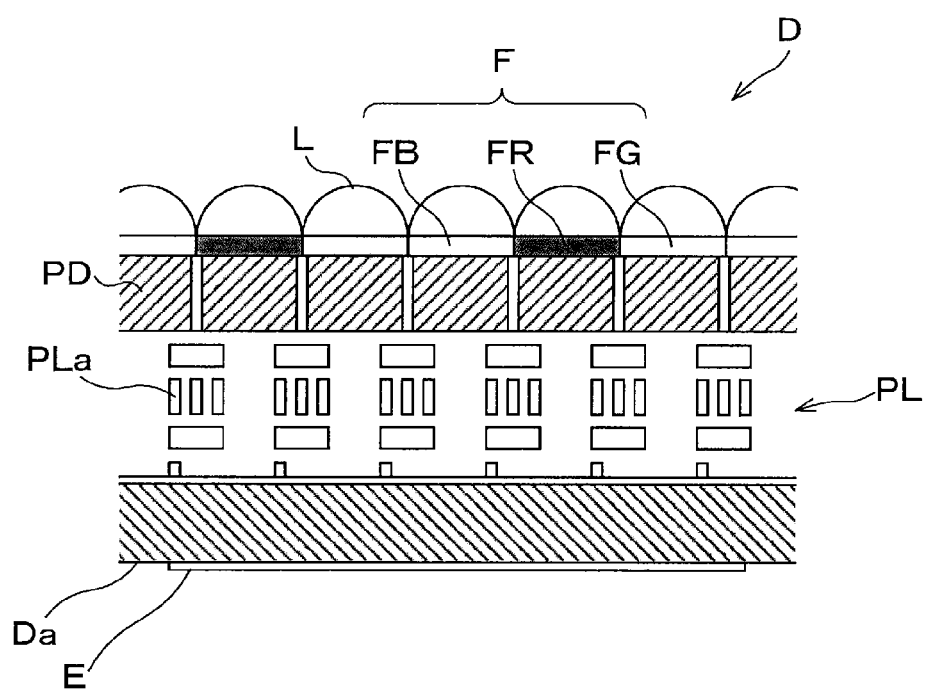
FIG. 2 is a sectional view schematically showing a configuration of the backside irradiation type imaging device.

FIG. 1 is a plan view schematically showing a configuration of a wafer as an inspection target on which a backside irradiation type imaging device is formed, and FIG. 2 is a sectional view schematically showing a configuration of the backside irradiation type imaging device.

As shown in FIG. 1, a plurality of backside irradiation type imaging devices D are formed on a substantially disc-shaped wafer W.

Each backside irradiation type imaging device D is a solid state imaging device, and has a photoelectric converter PD which is a photodiode, and a wiring layer PL including a plurality of wirings PLa, as shown in FIG. 2. Further, in the backside irradiation type imaging device D, when a side of the wiring layer PL is a side of a front surface of the wafer W, light incident from a side of a rear surface of the wafer W is received in the photoelectric converter PD via on-chip lenses L and color filters F. The color filters F includes red color filters FR, blue color filters FB, and green colors filter FG.

Further, electrodes E are formed on a front surface Da of the backside irradiation type imaging device D, that is, the front surface of the wafer W, and the electrodes E are electrically connected to the wirings PLa of the wiring layer PL. The wirings PLa are used to input an electric signal to circuit elements inside the backside irradiation type imaging device D and to output an electric signal from the same circuit elements to the outside of the backside irradiation type imaging device D.

As shown in FIG. 1, a non-device forming region R in which the backside irradiation type imaging devices D are not formed exists in the outer peripheral portion of the wafer W.

First Embodiment

Subsequently, an inspection apparatus according to a first embodiment will be described.

Figure 3:
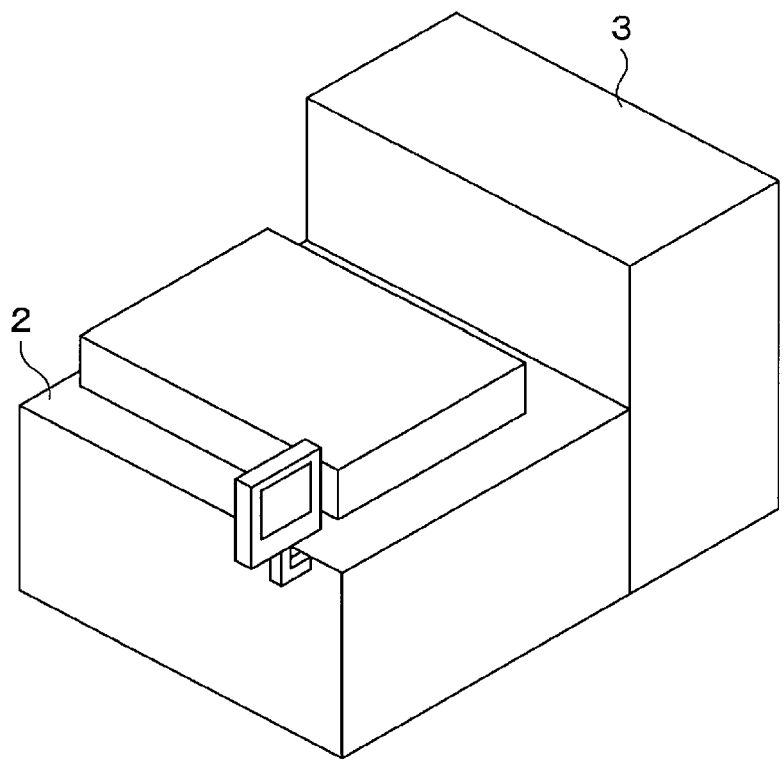
FIG. 3 is a perspective view showing a schematic configuration of a prober as an inspection apparatus according to a first embodiment.
Figure 4:
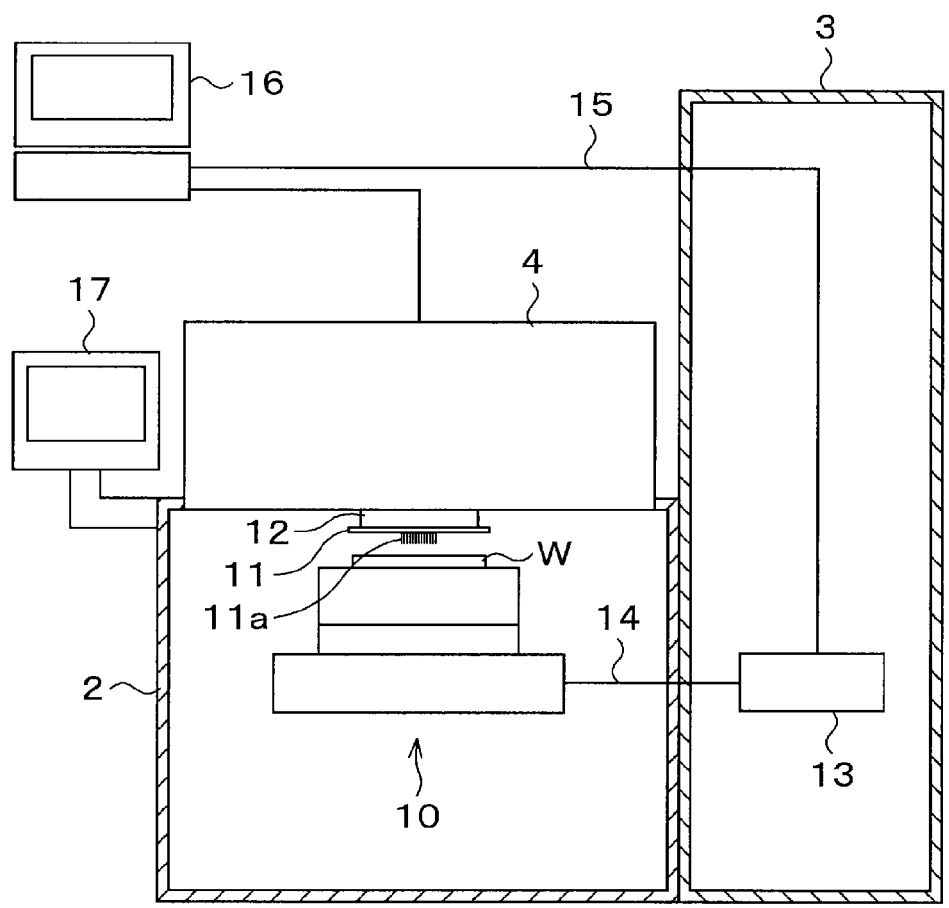
FIG. 4 is a front view showing the schematic configuration of the prober as the inspection apparatus according to the first embodiment.

FIGS. 3 and 4 are a perspective view and a front view showing a schematic configuration of a prober 1 as an inspection apparatus according to the first embodiment, respectively. In FIG. 4, in order to show constituent elements embedded in a storage chamber and a loader, which will be described later, of the prober 1 of FIG. 3, a part of the prober 1 is shown in a cross section.

The prober 1 inspects electrical characteristics of each of the plurality of backside irradiation type imaging devices D (hereinafter also abbreviated as imaging devices D) formed on the wafer W. As shown in FIGS. 3 and 4, the prober 1 includes a storage chamber 2, a loader 3 disposed adjacent to the storage chamber 2, and a tester 4 disposed so as to cover the storage chamber 2.

The storage chamber 2 is a hollow housing, and has a stage 10 as a mounting table on which the wafer W is mounted. The stage 10 holds the wafer W by clamping the non-device forming region R (see FIG. 1) in the outer peripheral portion of the wafer W so that a position of the wafer W with respect to the stage 10 does not shift. The stage 10 is configured to be movable in a horizontal direction and a vertical direction, so that the electrodes E on the front surface of the wafer W can be brought into contact with probes 11a of a probe card 11 by adjusting a relative position between the probe card 11 and the wafer W, which will be described later.

Further, the probe card 11 is disposed above the stage 10 in the storage chamber 2 so as to face the stage 10. The probe card 11 has the plurality of needle-shaped probes 11a formed correspondingly to the electrodes E on the front surface of the wafer W.

The probe card 11 is connected to the tester 4 via an interface 12. When the probe 11a comes into contact with the electrodes E of the imaging device D on the wafer W, respectively, each probe 11a supplies power from the tester 4 to the imaging device D via the interface 12 or transmits a signal from the imaging device D to the tester 4 via the interface 12.

The loader 3 takes out a wafer W accommodated in a FOUP (not shown), which is a transfer container, and transfers the wafer W to the stage 10 of the storage chamber 2. Further, the loader 3 receives a wafer W for which the inspection of the electrical characteristics of the imaging device D has been completed, from the stage 10, and accommodates the wafer W in the FOUP.

The loader 3 has a base unit 13 as a controller for controlling a power supply and the like. The base unit 13 is connected to the stage 10 via a wiring 14, and is connected to a tester computer 16 via a wiring 15. The base unit 13 controls an irradiating operation by a light emitter 30, which will be described later, of the stage 10 based on an input signal from the tester computer 16. Further, the base unit 13 controls an electric conducting operation to a heater 42 of the stage 10, which will be described later, based on a temperature measuring mechanism (not shown) of the stage 10. The base unit 13 may be installed in the storage chamber 2.

The tester 4 has a test board (not shown) that reproduces a part of a circuit configuration of a motherboard on which the imaging device D is mounted. The test board is connected to the tester computer 16. The tester computer 16 determines whether the imaging device D is good or bad based on the signal from the imaging device D. In the tester 4, circuit configurations of various types of motherboards can be reproduced by changing the test board.

The prober 1 further includes a user interface 17. The user interface 17 is provided to display information for a user and to input an instruction from the user, and includes, for example, a display panel having a touch panel, a keyboard, and the like.

In the prober 1 having the above-mentioned components, when the electrical characteristics of the imaging device D are inspected, the tester computer 16 transmits data to the test board connected to the imaging device D via each probe 11*a*. Then, the tester computer 16 determines whether or not the transmitted data has been correctly processed by the test board, based on an electric signal from the test board.

Figure 5:
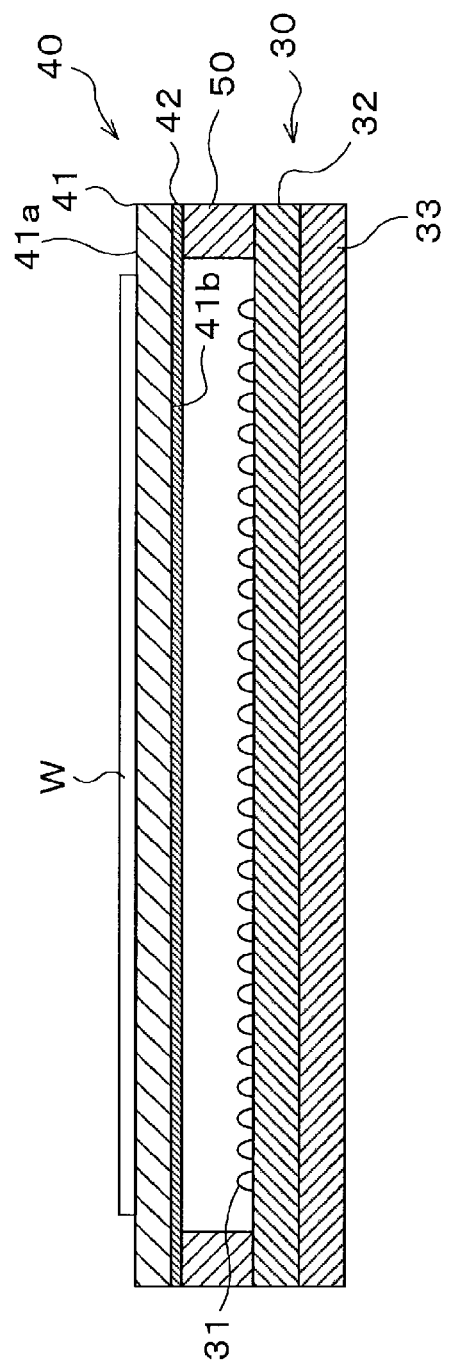
FIG. 5 is a sectional view schematically showing a configuration of a stage.

Next, the configuration of the stage 10 will be described. FIG. 5 is a sectional view schematically showing the configuration of the stage 10.

The wafer W is placed on the stage 10 so that the rear surface of the imaging device D faces the stage 10, and the stage 10 has the light emitter 30 and a transmitter 40, as shown in FIG. 5.

The light emitter 30 is disposed at a location facing the wafer W with the transmitter 40 interposed therebetween, and emits light toward the transmitter 40, that is, toward the wafer W.

The light emitter 30 has a plurality of LEDs (Light Emitting Diodes) 31 as light sources, and further has a substrate 32 and a heat radiating plate 33.

Each of the LEDs 31 orients in a direction toward the wafer W, and for example, emits light such that light transmitted through the transmitter 40 includes light having a wavelength within an inspection range. The light having the wavelength in the inspection range is, for example, light having a wavelength in a visible light range, and may include light other than the visible light range, such as an infrared ray, depending on a type of the imaging device D.

Further, in a plan view, a region where the LEDs 31 are installed (hereinafter referred to as an "LED forming region") is a region overlapping the wafer W mounted on the stage 10, and a size of the LED forming region is the same as that of the wafer W. The LEDs 31 are installed at equal intervals in the LED forming region.

In the following description, it is assumed that the turn-on and turn-off of the LEDs 31 is not controlled for each LED 31 or the like, but all the LEDs 31 are collectively controlled as one unit.

The substrate 32 holds the LEDs 31 and is formed with a wiring pattern (not shown) for controlling the LEDs 31.

The heat radiating plate 33 releases heat of the LEDs 31 to the outside of the stage 10 and is formed of, for example, a metallic material. The heat radiating plate 33 may be formed with a path through which a coolant such as water for cooling the LEDs 31 passes.

The transmitter 40 includes a flat plate 41 formed of a light transmitting material, and the wafer W is placed thereon such that the transmitter 40 is in contact with the rear surface of the wafer W. The "light transmitting material" is a material that transmits light having a wavelength within the inspection range.

The flat plate 41 is formed in a disc shape, for example, which corresponds to the shape of the wafer W in a plan view, and has substantially the same diameter as that of the wafer W. For example, the diameter of the flat plate 41 is about 350 mm when the diameter of the wafer W is 300 mm.

The transmitter 40 transmits the light emitted from the light emitter 30 toward the wafer W while diffusing the same. In the transmitter 40, in order to diffuse the light on transmission, the flat plate 41 is formed of transparent glass, and a surface 41*a* of the flat plate 41 facing the wafer W is a sanded surface. The sanded surface may be on a surface 41*b* of the flat plate 41 opposite to the wafer W, or may be on both the surface 41*a* and the surface 41*b*. The light incident on the transmitter 40 from the LEDs 31 of the light emitter 30 is emitted from the transmitter 40 in a state of being diffused on the sanded surface of the flat plate 41.

Further, the transmitter 40 has the heater 42 as a temperature adjusting mechanism for adjusting a temperature of the wafer W, that is, the imaging device D. The heater 42 is formed of a light transmitting material so as not to interfere with the transmission of light from the light emitter 30. Specifically, the heater 42 is, for example, a heater pattern formed of an indium tin oxide (ITO) film having a desired shape. The heater pattern formed of the ITO film is formed by a film forming process such as a vacuum vapor deposition process on the flat plate 41, for example. The heater 42 heats the wafer W. Further, an outer portion of the wafer W is less likely to be heated than an inner portion thereof. Therefore, when a line width of the heater pattern is uniform, the heater pattern may be formed so that a pattern density is high in a region corresponding to the outer portion of the wafer W and is low in a region corresponding to the inner portion of the wafer W. As a result, the temperature of the wafer W can be made uniform in the plane of the wafer W.

Further, when the heater 42 is installed between the wafer W and the flat plate 41, that is, above the flat plate 41, an intensity of the light emitted through the transmitter 40 becomes non-uniform due to the heater 42. Therefore, the heater 42 is installed between the light emitter 30 and the flat plate 41, that is, below the flat plate 41.

In the above example, although only the heater 42 for heating the wafer W is installed as the temperature adjusting mechanism, a cooler for cooling the wafer W may be installed. The cooler is, for example, a flow path for a light-transmitting coolant (water or the like) formed inside a flat plate formed of a light-transmitting material. When the cooler is installed in addition to the heater 42, the cooler is installed between the light emitter 30 and the heater 42, that is, below the heater 42, in consideration of a heating efficiency of the heater 42.

The transmitter 40 composed of the above-mentioned members is supported by the substrate 32 of the light emitter 30, for example, via a support 50.

Further, the transmitter 40 is provided with a clamping mechanism (not shown) for clamping the non-device forming region R in the outer peripheral portion of the wafer W to hold the wafer W.

In the above-described prober 1, the light intensity distribution of the light from the plurality of LEDs 31 of the light emitter 30 is not uniform in the plane parallel to the wafer W immediately after the light is emitted from the LEDs 31. For example, immediately after the emission, the light intensity is weaker in portions located between the LEDs 31 in a plan view than in portions overlapping the LEDs 31 in a plan view. However, as described above, the light from the plurality of LEDs 31 of the light emitter 30 is emitted from the transmitter 40 in a state of being diffused on the sanded surface of the flat plate 41. Therefore, when the light from the plurality of LEDs 31 of the light emitter 30 is emitted from the transmitter 40, that is, when the light is incident on the wafer W, the light intensity distribution becomes uniform in the plane parallel to the wafer W. In this way, the prober 1 irradiates the wafer W with the light, which has a uniform in-plane light intensity distribution, from the stage 10 having the light emitter 30 and the transmitter 40.

Further, the in-plane intensity distribution of the light emitted from the transmitter 40 changes depending on arrangement of the LEDs 31, a distance from the LEDs 31 to the flat plate 41, and the like.

When a gap between adjacent LEDs 31 is small, the in-plane intensity distribution of the light becomes good, but the number of LEDs 31 required to irradiate a wide area increases.

Further, when the distance from the LEDs 31 to the flat plate 41 is long, the in-plane intensity distribution of the light becomes good, but an overall light intensity becomes weak and a size of the inspection apparatus increases.

Further, a thickness of the flat plate 41 affects the heating efficiency by the heater 42 and a mechanical strength.

Therefore, the thickness of the flat plate 41, a pitch of the LEDs 31, and the distance from the LEDs 31 to the flat plate 41 are set in consideration of the above points. The pitch 31 of the LEDs 31 refers to a distance between centers of adjacent LEDs 31. The distance from the LEDs 31 to the flat plate 41 refers to a distance from a surface of the substrate 32 facing the flat plate 41 to a surface of the flat plate 41 facing the substrate 32.

Next, an example of an inspection process for the wafer W by using the prober 1 will be described. In the following description, it is assumed that one imaging device D is inspected every inspection time.

First, the wafer W is taken out from the FOUP of the loader 3 and is transferred into the storage chamber 2. Then, the wafer W is placed on the stage 10 such that the rear surface of the imaging device D formed on the wafer W faces the stage 10 and the rear surface of the wafer W is in contact the stage 10.

Subsequently, the stage 10 is moved, and the probes 11a provided above the stage 10 come into contact with the electrodes E of the imaging device D as an inspection target.

Then, all the LEDs 31 of the light emitter 30 are turned on, and the light is emitted from the light emitter 30 toward the rear surface of the imaging device D. The emitted light transmits through the transmitter 40 while being diffused by the transmitter 40, and is irradiated onto the wafer W.

Along with the irradiation of the wafer W with the light, an inspection signal is input to the probes 11a. As a result, the imaging device D is inspected. During the inspection, the temperature of the wafer W is measured by the temperature measuring mechanism (not shown), and based on the measurement result, the heater 42 is controlled to adjust the temperature of the wafer W to a desired value, thereby adjusting the temperature of the imaging device D to a desired value.

Thereafter, the same process as described above is repeated until the inspection of all the imaging devices D is completed.

As described above, in the present embodiment, the stage 10 has the transmitter 40, which includes the flat plate 41 formed of a light transmitting material and on which the wafer W is placed, and the light emitter 30, which is disposed at a location facing the wafer W with the transmitter 40 interposed therebetween and emits the light toward the transmitter 40. Then, the transmitter 40 transmits the light from the light emitter 30 while diffusing the same. Therefore, the backside irradiation type imaging device D can be inspected. Further, since the number of probes 11a is not limited, the inspection can be performed in a short time. Further, in the present embodiment, when the light from the light emitter 30 is emitted from the transmitter 40, the light intensity distribution becomes uniform in the plane parallel to the wafer W. Therefore, the wafer W can be irradiated with the light having a uniform in-plane light intensity distribution from the stage 10.

Further, in the present embodiment, the heater 42 formed of a light transmitting material is provided between the light emitter 30 and the flat plate 41. Therefore, the temperature of the wafer W can be adjusted without deteriorating the in-plane uniformity in intensity distribution of the light with which the wafer W is irradiated.

Further, in the present embodiment, since the LEDs 31 are used as the light source for inspection, it is possible to prevent the stage 10 from increasing in size and further prevent the storage chamber 2 and the prober 1 from increasing in size.

Furthermore, in the present embodiment, as a mechanism for holding the wafer W, the clamping mechanism for clamping the non-device forming region R in the outer peripheral portion of the wafer W is used. Therefore, since it is not necessary to form a hole for sucking and holding the wafer W in the flat plate 41, it is possible to prevent the hole from affecting the in-plane uniformity intensity distribution of the light with which the wafer W is irradiated.

In the above description, the entirety of the plurality of LEDs 31 is treated as one unit, and turning-on and turning-off of the plurality of LEDs 31 is collectively controlled. However, the plurality of LEDs 31 may be divided based on regions to form a plurality of units, and turning-on and turning-off of the units may be independently controlled. In this case, when inspecting a certain imaging device D, only a unit corresponding to a region in which the imaging device exists may be turned on.

Further, in the above description, one imaging device D is inspected every inspection time, but a plurality of imaging devices D may be collectively inspected at one inspection time.

In the above example, the flat plate 41 is formed of transparent glass, and the surface 41a of the flat plate 41 facing the wafer W is formed as the sanded surface.

The flat plate 41 is not limited to the above-described example, but may be formed of bubble quartz containing bubbles therein. When the such flat plate 41 is used, the light incident on the transmitter 40 from the light emitter 30 passes through the flat plate 41 while being diffused by the bubbles in the flat plate 41, and is emitted from the transmitter 40. Therefore, even when this flat plate 41 is used, the wafer W can be irradiated with the light having a uniform in-plane light intensity distribution.

(Another Modification of Flat Plate 41)

The flat plate 41 may be formed of transparent ceramics such as sintered alumina. The transparent ceramics has grain boundaries and defects therein. Therefore, when the flat plate 41 of the present example is used, the light incident on the transmitter 40 from the light emitter 30 passes through the flat plate 41 while being diffused by the grain boundaries and defects in the flat plate 41, and is emitted from the transmitter 40. Therefore, even when this flat plate member 41 is used, the wafer W can be irradiated with the light having a uniform in-plane light intensity distribution.

(Another Modification of Flat Plate 41)

The flat plate 41 may be a holographic diffuser. The holographic diffuser is obtained by forming a hologram pattern (a collection of aperiodic uneven patterns of about 5 μm) on a transparent glass substrate such as a quartz glass substrate. When the flat plate 41 formed of the holographic diffuser is used, the light incident on the transmitter 40 from the light emitter 30 passes through the flat plate 41 while being diffused by the hologram pattern formed on the flat plate 41, and is emitted from the transmitter 40. Therefore, even when this flat plate member 41 is used, the wafer W can be irradiated with the light having a uniform in-plane light intensity distribution.

Second Embodiment

Figure 6:
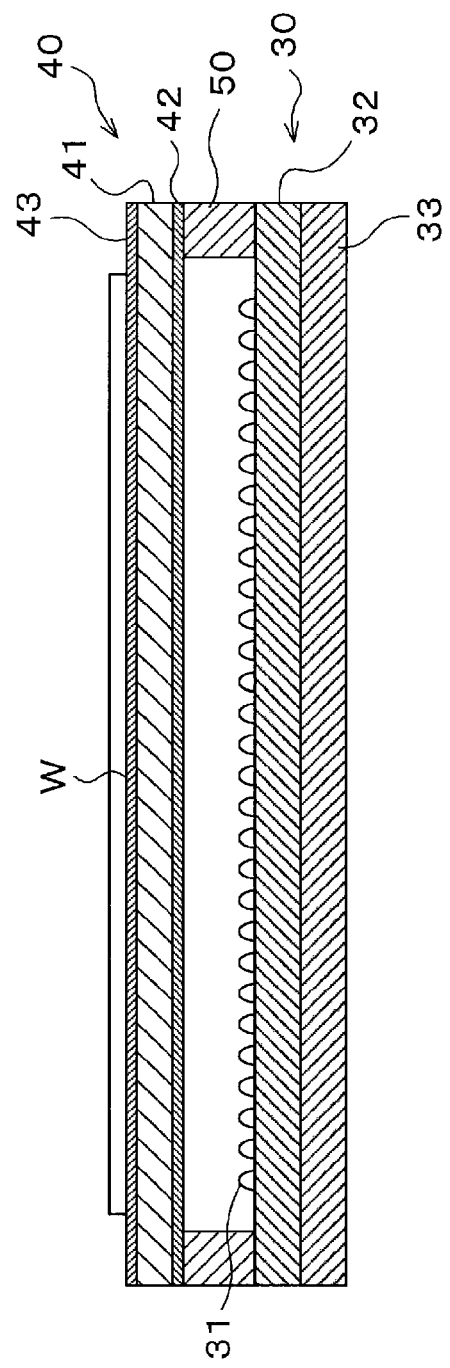
FIG. 6 is a sectional view schematically showing a configuration of a stage included in a prober as an inspection apparatus according to a second embodiment.

FIG. 6 is a sectional view schematically showing a configuration of the stage 10 included in a prober as an inspection apparatus according to a second embodiment.

In the stage 10 of the present embodiment, as shown in FIG. 6, the transmitter 40 has a low-refractive index part 43 in addition to the flat plate 41 and the heater 42.

The low-refractive index part 43 has a refractive index lower than that of the flat plate 41, and is provided between the wafer W and the flat plate 41 so as to overlap the flat plate 41. The rear surface of the wafer W placed on the stage 10 comes into contact with the low-refractive index part 43. For example, when the flat plate 41 is formed of quartz glass as transparent glass, a different type of quartz glass from the flat plate 41 (for example, quartz glass being different in type or proportion of impurities from the flat plate 41) is used for the low-refractive index part 43. As a result, the low-refractive index part 43 can have a refractive index lower than that of the flat plate 41.

Further, by using fluororesin as a material of the low-refractive index part 43 and adjusting an additive material to the fluororesin, the low-refractive index part 43 can have a refractive index lower than that of the flat plate 41.

Furthermore, the low-refractive index part 43 may be formed of an electro-optical crystal having an electro-optical effect in which the refractive index changes by applying an electric field.

The low-refractive index part 43 is formed by, for example, a CVD method when the low-refractive index part 43 is quartz glass or an electro-optical crystal, and is formed by, for example, a spin coating method when the low-refractive index part 43 is fluororesin.

In the present embodiment, among the light transmitted through the flat plate 41, light having a small incident angle with respect to the low-refractive index part 43 is incident on and passes through the low-refractive index part 43, and is emitted toward the wafer W. However, light having a large incident angle with respect to the low-refractive index part 43 is not incident on the wafer W, because such light is reflected by the surface of the low-refractive index part 43 facing the flat plate 41. As described above, in the present embodiment, since the incident angle of light from the flat plate 41 to the low-refractive index part 43 is limited, the incident angle of light transmitted through the low-refractive index part 43 and radiated onto the wafer W is also limited. That is, in the present embodiment, the incident angle of light with which the wafer W is irradiated can be limited. Therefore, the prober 1 can also be used for an inspection in which the incident angle of light onto the imaging device D needs to be limited.

The embodiments disclosed in the present disclosure should be considered to be exemplary in all respects and not restrictive. The above embodiments may be omitted, replaced, or changed in various forms without departing from the appended claims and the gist thereof.

In addition, the following aspects also belong to the technical scope of the present disclosure.

(1) An inspection apparatus for inspecting an inspection target device formed on an inspection object, the inspection target device being a backside irradiation type imaging device into which light is incident from a rear surface of the backside irradiation type imaging device, which is a surface opposite to a side on which a wiring layer is provided, the inspection apparatus including:
    a stage on which the inspection object is mounted such that the stage faces the rear surface of the imaging device,
    wherein the stage includes:
        a transmitter including a flat plate formed of a light transmitting material, and configured to mount the inspection object on the transmitter; and
        a light emitter disposed at a location facing the inspection object with the transmitter interposed between the light emitter and the inspection object, and configured to emit light toward the transmitter, and
    wherein the transmitter transmits the light from the light emitter while diffusing the light.

According to (1), the backside irradiation type imaging device can be inspected. Further, since it is not necessary to form an opening for inspection in a probe card, the number of probes is not limited and the inspection can be performed in a short time. Further, in the present embodiment, when the light from the light emitter is emitted from the transmitter, the in-plane light intensity distribution becomes uniform. Therefore, it is possible to irradiate the inspection object with light having a uniform in-plane light intensity distribution from the stage.

(2) The inspection apparatus of (1), wherein the flat plate is formed of transparent glass, and has a sanded surface as a surface facing the inspection object.

(3) The inspection apparatus of (1), wherein the flat plate is formed of bubble quartz.

(4) The inspection apparatus of (1), wherein the flat plate is formed of transparent ceramics.

(5) The inspection apparatus of (1), wherein the flat plate is a holographic diffuser.

(6) The inspection apparatus of any one of (1) to (5), wherein the transmitter has a temperature adjusting mechanism, which is formed of a light transmitting material and provided between the light emitter and the flat plate.

According to (6), it is possible to adjust the temperature of the inspection object without deteriorating the in-plane uniformity of the intensity distribution of the light with which the inspection object is irradiated.

(7) The inspection apparatus of (6), wherein the temperature adjusting mechanism has a pattern of a transparent electrode film, which is formed by a film forming process on the flat plate.

(8) The inspection apparatus of any one of (1) to (7), wherein the light emitter has a plurality of LEDs.

(9) The inspection apparatus of any one of (1) to (8), wherein the transmitter has a low-refractive index part, which has a refractive index lower than that of the flat plate and provided between the inspection object and the flat plate.

According to (9), it is possible to limit the angle of the light with which the inspection object is irradiated.

(10) An inspection method of inspecting an inspection target device formed on an inspection object, the inspection target device being a backside irradiation type imaging device into which light is incident from a rear surface of the backside irradiation type imaging device, which is a surface opposite to a side on which a wiring layer is provided, the method including:
    mounting the inspection object on a stage such that the stage faces the rear surface of the imaging device;

emitting light toward the rear surface of the imaging device from a light emitter, which is disposed at a location facing the rear surface of the imaging device mounted on the stage; and transmitting the light from the light emitter while diffusing the light by a transmitter, which is provided between the inspection object mounted on the stage and the light emitter, and irradiating the inspection object with the transmitted light.

EXPLANATION OF REFERENCE NUMERALS

1: prober, 10: stage, 30: light emitter, 40: transmitter, 41: flat plate, D: backside irradiation type imaging device, W: wafer

What is claimed is:

1. An inspection apparatus for inspecting an inspection target device formed on an inspection object, the inspection target device being a backside irradiation type imaging device into which light is incident from a rear surface of the backside irradiation type imaging device, which is a surface opposite to a side on which a wiring layer is provided, the inspection apparatus comprising:
    a stage on which the inspection object is mounted such that the stage faces the rear surface of the backside irradiation type imaging device,
    wherein the stage comprises:
    a transmitter including a flat plate formed of a light transmitting material, and configured to mount the inspection object on the transmitter; and
    a light emitter disposed at a location facing the inspection object with the transmitter interposed between the light emitter and the inspection object, and configured to emit light toward the transmitter,
    wherein the transmitter transmits the light from the light emitter while diffusing the light,
    wherein the flat plate is configured to diffuse the light, and
    wherein the transmitter includes a temperature adjusting mechanism, which is formed of a light transmitting material and provided between the light emitter and the flat plate.

2. The inspection apparatus of claim 1, wherein the flat plate is formed of transparent glass, and has a sanded surface on a surface facing the inspection object.

3. The inspection apparatus of claim 1, wherein the flat plate is formed of bubble quartz.

4. The inspection apparatus of claim 1, wherein the flat plate is formed of transparent ceramics.

5. The inspection apparatus of claim 1, wherein the flat plate is a holographic diffuser.

6. The inspection apparatus of claim 1, wherein the temperature adjusting mechanism has a pattern of a transparent electrode film, which is formed by a film forming process on the flat plate.

7. The inspection apparatus of claim 1, wherein the light emitter has a plurality of LEDs.

8. The inspection apparatus of claim 1, wherein the transmitter has a low-refractive index part provided between the inspection object and the flat plate so as to overlap the flat plate, and
    wherein a refractive index of the low-refractive index part is lower than a refractive index of the flat plate.

9. An inspection method of inspecting an inspection target device formed on an inspection object, the inspection target device being a backside irradiation type imaging device into which light is incident from a rear surface of the backside irradiation type imaging device, which is a surface opposite to a side on which a wiring layer is provided, the method comprising:
    mounting the inspection object on a stage such that the stage faces the rear surface of the backside irradiation type imaging device;
    emitting light toward the rear surface of the backside irradiation type imaging device from a light emitter, which is disposed at a location facing the rear surface of the backside irradiation type imaging device mounted on the stage;
    transmitting the light from the light emitter while diffusing the light by a transmitter, which is provided between the inspection object mounted on the stage and the light emitter, and irradiating the inspection object with the transmitted light, the transmitter including a flat plate formed of a light transmitting material and configured to diffuse the light; and
    adjusting a temperature of the backside irradiation type imaging device using a temperature adjusting mechanism, which is formed of a light transmitting material and provided between the light emitter and the flat plate.

* * * * *